United States Patent [19]
Saitoh

[11] Patent Number: 6,031,762
[45] Date of Patent: Feb. 29, 2000

[54] NON-VOLATILE SEMICONDUCTOR MEMORY

[75] Inventor: Minoru Saitoh, Yamagata, Japan

[73] Assignee: NEC Corporation, Tokyo, Japan

[21] Appl. No.: 09/276,507

[22] Filed: Mar. 25, 1999

[30] Foreign Application Priority Data

Mar. 31, 1998 [JP] Japan .................................. 10-087707

[51] Int. Cl.$^7$ .................................................. G11C 7/00
[52] U.S. Cl. ............................... 365/185.24; 365/185.29; 365/218
[58] Field of Search ........................ 365/185.24, 185.29, 365/218, 189.01

[56] References Cited

U.S. PATENT DOCUMENTS

| | | | |
|---|---|---|---|
| 5,687,345 | 11/1997 | Matsubara et al. ............ | 365/185.24 X |
| 5,708,605 | 1/1998 | Sato .................... | 365/185.29 |
| 5,796,652 | 8/1998 | Takeshima et al. ........... | 365/185.24 X |
| 5,828,604 | 10/1998 | Kawai et al. ................... | 365/185.24 X |
| 5,835,415 | 11/1998 | Marari ............................ | 365/185.24 X |

Primary Examiner—Do Hyun Yoo
Attorney, Agent, or Firm—Sughrue, Mion, Zinn Macpeak & Seas, PLLC

[57] ABSTRACT

There is provided a non-volatile semiconductor memory which is capable of establishing a proper reading voltage for an erasure threshold voltage and a proper writing time for the reading voltage by detecting the threshold voltages for writing and erasing in a memory cell array. The present non-volatile semiconductor memory, which is called a flash EEPROM, includes a first memory cell array 1, a second memory cell array 2, a row decoder 3, a line decoder 4, a reading control circuit 5, a writing and erasing control circuit 6, a writing time control circuit 7, a high voltage generating circuit 8, a counter circuit 13, a 1/N circuit 9, and a reading voltage generating circuit 11. The first memory cell array 1 and the second memory cell array 2 are formed on a same memory cell array, and all of the data stored in both memory cell arrays can be erased at once. Thus, all the memory cells in the memory cell array have the same erasure threshold voltage. The first memory cell array 1 is designated to be an area in which data can be freely written, and the second memory cell array 2 is designated as an area for detecting the threshold voltages of the memory cells so that it is not permitted to write in the second memory cell array 2 except when detecting the threshold voltage.

5 Claims, 5 Drawing Sheets

NON-VOLATILE SEMICONDUCTOR MEMORY

BACKGROUND OF THE INVENTION

1. Field of the Invention

The present invention relates to a non-volatile semiconductor memory used for storing data in portable data processing devices.

This application is based on Patent Application No. Hei 10-087707 filed in Japan, the contents of which are incorporated herein by reference.

2. Background Art

Conventional flash EEPROM has drawbacks in that read errors often occur caused by a reduced writing threshold voltage or an increased erasure threshold voltage due to manufacturing variations or to rewriting stress.

Since this problem is caused when the writing threshold voltage is degraded to a lower voltage than the read-out voltage or when the erasure threshold voltage is degraded so that it becomes greater than the read-out voltage, it is always required before writing step to optimize the threshold voltages so as to reduce the threshold voltage of erasing to be less than the read-out voltage and to increase the threshold voltage of the writing to be greater than the read-out voltage.

Figure 5:
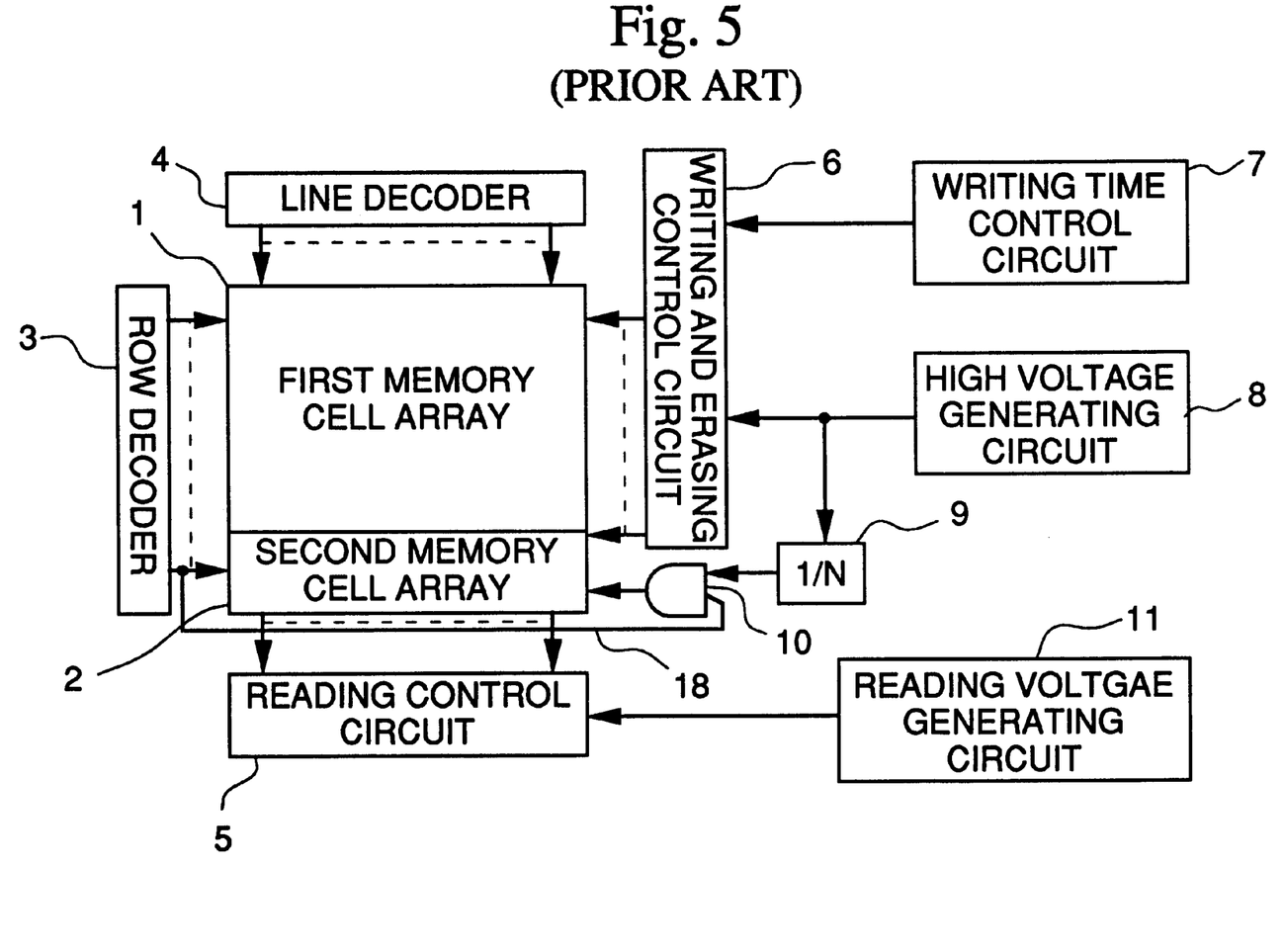
FIG. 5 is a block-diagram showing the conventional non-volatile semiconductor memory.

In order to solve the above described problem, a technique was proposed in Japanese Patent Application, First Application No. Hei 5-28788, in which, the writing condition for writing into the second memory cell array 2, used for writing data-bits for monitoring changes of the threshold voltages over time, is varied from the writing condition for writing into the first memory cell array 1, and if a degradation of the writing condition is found, the first memory cell array is rewritten. As shown in FIG. 5, the technique disclosed in the above document still has the problem that the reading voltage cannot be optimized, since the erasure threshold voltage is not monitored.

That is, a problem still remains in that, when the erasing voltage increases into larger than the reading voltage due to a deterioration of the threshold voltage level, reading failure occurs.

It is therefore the object of the invention to provide a non-volatile semiconductor memory device, which is capable of setting or establishing the optimum reading voltage in comparison with the erasure threshold voltage and also of setting or establishing the optimum writing time based on the reading voltage by detecting the writing threshold voltage and the erasure threshold voltages of the memory cell array for writing data-bits for monitoring the deterioration over time.

SUMMARY OF THE INVENTION

The object of the present invention is to provide a non-volatile memory (hereinafter, called flash EEPROM) which is capable of being written to and totally erased electrically, wherein the memory is provided with a means for detecting the threshold voltage in both states either when electric charges are not contained in the memory (hereinafter, called the "erased state") or when contained in the memory (hereinafter, called the written state); and a means for randomly modifying a reading voltage and a writing time based on the detected threshold voltage; and wherein the optimum reading voltage and the optimum writing time can be established based on a erasure threshold voltage.

Figure 1:
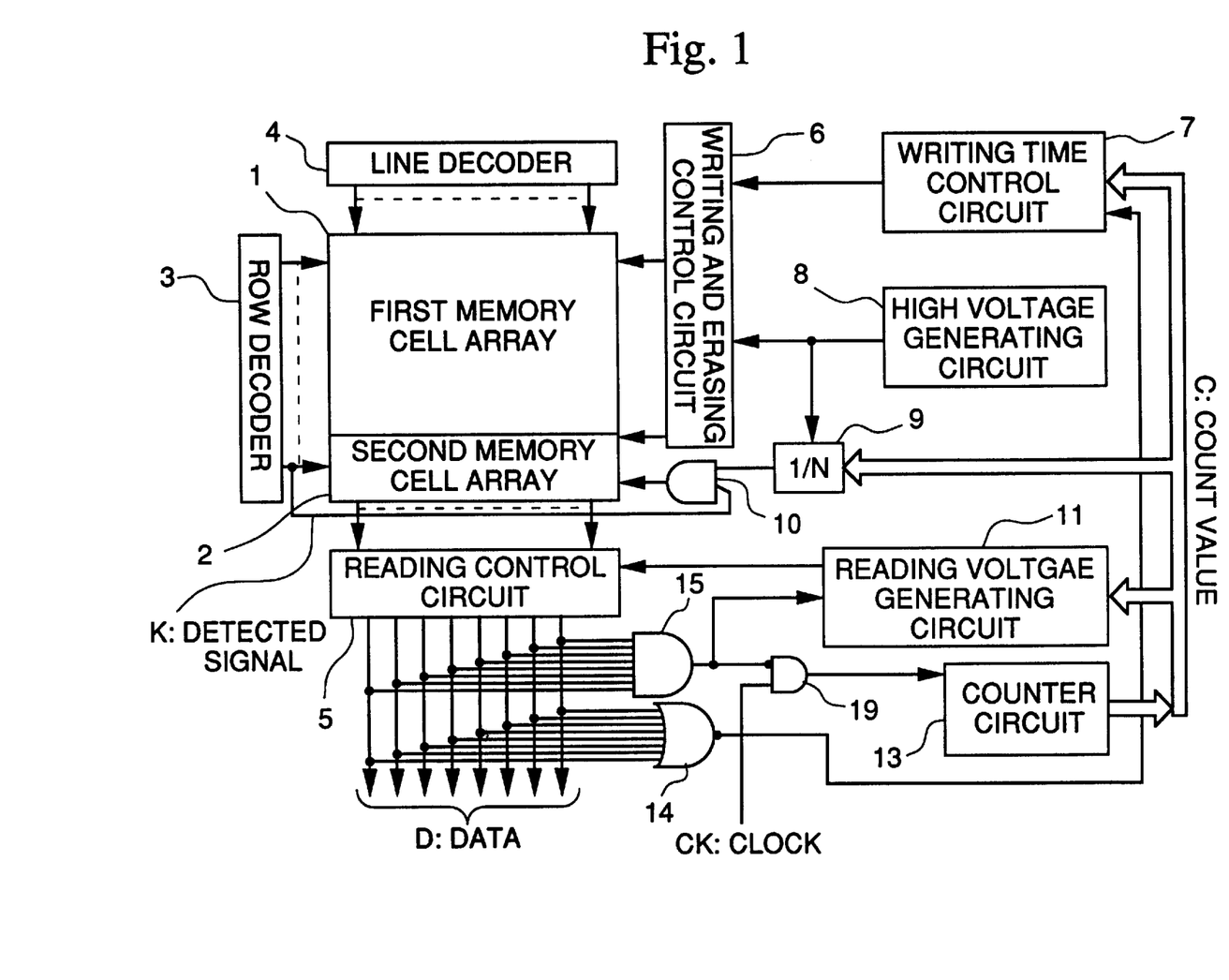
FIG. 1 is a block diagram showing the structure of the non-volatile semiconductor memory according to one embodiment of the present invention.

In FIG. 1, assuming that the first memory cell array 1 is formed on the same memory cell array as the second memory cell array 2, the erasing of both first and second memory cell arrays 1 and 2 can be executed by the same erasure threshold voltage, and the writing can be performed in the same writing time. It is also assumed that the first memory cell array 1 is an area in which writing can be freely performed, and the second memory cell array 2 is an area for detecting the threshold voltages, so that writing into the second memory cell 2 is only possible when detecting the thresholds.

The detection of the threshold voltages in the second memory cell 2 is executed before writing into the first memory cell 1, by dividing a voltage output from a high voltage generating circuit 8 into 1/N by a 1/N voltage divider and supplying it to the second memory cell array 2, and by incrementing the voltage repeatedly by 1/N until all of the data output from the read control circuit 5 becomes "H". Subsequently, the writing is executed into the second memory cell array 2, and the writing threshold voltage is detected as well as the erasure threshold voltage.

Furthermore, the counter circuit 13 executes a counting operation and outputs the counted value 12 until detecting the threshold voltages of the second memory array 2. The counted value 12 at the time of detecting the threshold value for erasing is input in a reading voltage generation circuit 11 to output the reading voltage. The counted value 12 at the time of detecting the writing threshold voltage is input in a writing time control circuit 7 and the writing time is established from the difference from the counted value 12 at the time of detecting the threshold voltage of erasing.

As hereinabove described, the present memory cell array is capable of executing correct reading by, when writing into the first memory cell array 1, writing for a writing time wherein the writing voltage is always higher than the reading voltage, and by, when reading, establishing a reading voltage at a voltage which is higher than the erasure threshold voltage and lower than the writing threshold voltage.

Therefore, when the erasure threshold voltage is degraded by less than degradation of the reading voltage, or when the writing threshold voltage is degraded less than the reading voltage because of the manufacturing variance, or the stress caused by rewriting, it is possible to avoid reading errors caused by inversion of the reading voltage and the threshold voltage, and to improve the manufacturing yields by modifying the reading voltage and the writing their to their optimum values.

DETAILED DESCRIPTION OF THE PREFERRED EMBODIMENTS

Preferred embodiments of the present invention will be described hereinafter with reference to the attached drawings. FIG. 1 is a block-diagram showing the structure of the non-volatile semiconductor memory device according to one embodiment of the present invention, for example, a flash EEPROM (electrically erasable programmable read-only memory). The flash EEPROM shown in FIG. 1 is comprised of a first memory cell array 1, a second memory cell array 2, a row decoder 3, a line-decoder 4, a read control circuit 5, a write and erase control circuit 6, a writing time control circuit 7, a high voltage generation circuit 8, a counter circuit 13, a 1/N circuit 9 and a reading voltage generation circuit 11.

The first memory cell array 1 and the second memory cell array 2 are formed on the same memory cell array, and data stored in both memory cells can be erased as a whole. Thus, the memory cells in both first and second memory cell arrays have the same threshold voltage. The first memory cell array 1 is designed so as to be an area to be written randomly, and the second memory cell array is designated to be an area to detect the threshold voltage of the memory cell, so that it is prohibited to write in the second memory cell array except when detecting the threshold voltage.

The writing and erasing control circuit 6 supplies a voltage for writing/erasing generated at the high voltage generating circuit 8 to a memory cell having an address shown by a row decoder 3 and a line decoder 4. The writing and erasing control circuit 6 supplies the writing voltage only for a time determined by the writing time control circuit 7 and also supplies the erasing voltage to the memory cell for a predetermined time. The reading control circuit 5 supplies the reading voltage generated by the reading voltage generating circuit 11 to a memory cell of the first memory cell array having an address indicated by the row decoder 3 and the line decoder 4, and outputs the data D to the outside of the memory.

This data D is output as "L", when the reading voltage is lower than the threshold voltage of the memory cell, that is, when a written memory cell is read; and the data D is output as "H", when the reading voltage is higher than the threshold voltage of the memory cell, that is, when an erased memory cell is read.

The second memory cell array 2, the counter 13, and the 1/N circuit 9 are provided for detecting the threshold voltage of the second memory cell array 2. Before writing into the first memory cell array, the erasure threshold voltage of the second memory cell array 2 is detected, and all of the second memory cell array 2 is then written, and the writing threshold voltage in the second memory cell array is then detected.

The 1/N circuit 9 divides the voltage output from the high voltage generation circuit 8 and the divided voltage is supplied to the second memory cell array 2. The 1/N circuit 9 performs the detection of the threshold voltage of erasing by repeatedly incrementing the voltage by 1/N until all the data 17 output from the read control circuit becomes "H" and it is judged that the erasure threshold voltage for every second memory cell array 2 is detected. The counter circuit 13 performs counting operations and outputs the counter value C, while the clock 16 is successively input from AND 19 until detection of the erasure threshold voltage is completed. The counter circuit 13 supplies the counted value C to the 1/N circuit 9. The counter circuit 9 repeatedly increments the voltage by 1/N when the counted value C is input.

At the time when the second memory cell array 2 detects the erasure threshold voltage, the counter circuit 13 supplies the counted value C to the reading voltage generation voltage for establishing the optimum reading voltage for a erasure threshold voltage. After the erasure threshold voltage of the second memory cell array 2 is detected, all the memory cells of the second memory cell array are subjected to writing for detecting the writing threshold voltage, similar to the detection of the erasing threshold value.

Here, when detection of the writing threshold voltage is performed, the writing threshold voltage is regarded as detected, if there is one "H" in the data D. The counter circuit 13 performs the counting operation successively from the counted value C at the time of detecting the erasing threshold value. The writing time control circuit 7 calculates the optimum writing time for a reading voltage from the difference between the counted value C, input at the time n when the writing threshold voltage is detected and the counted value C at the time of detecting the erasing threshold value.

An example of an operation of one embodiment of the present invention will be described hereinafter with reference to FIGS. 1 and 2.

Figure 2:
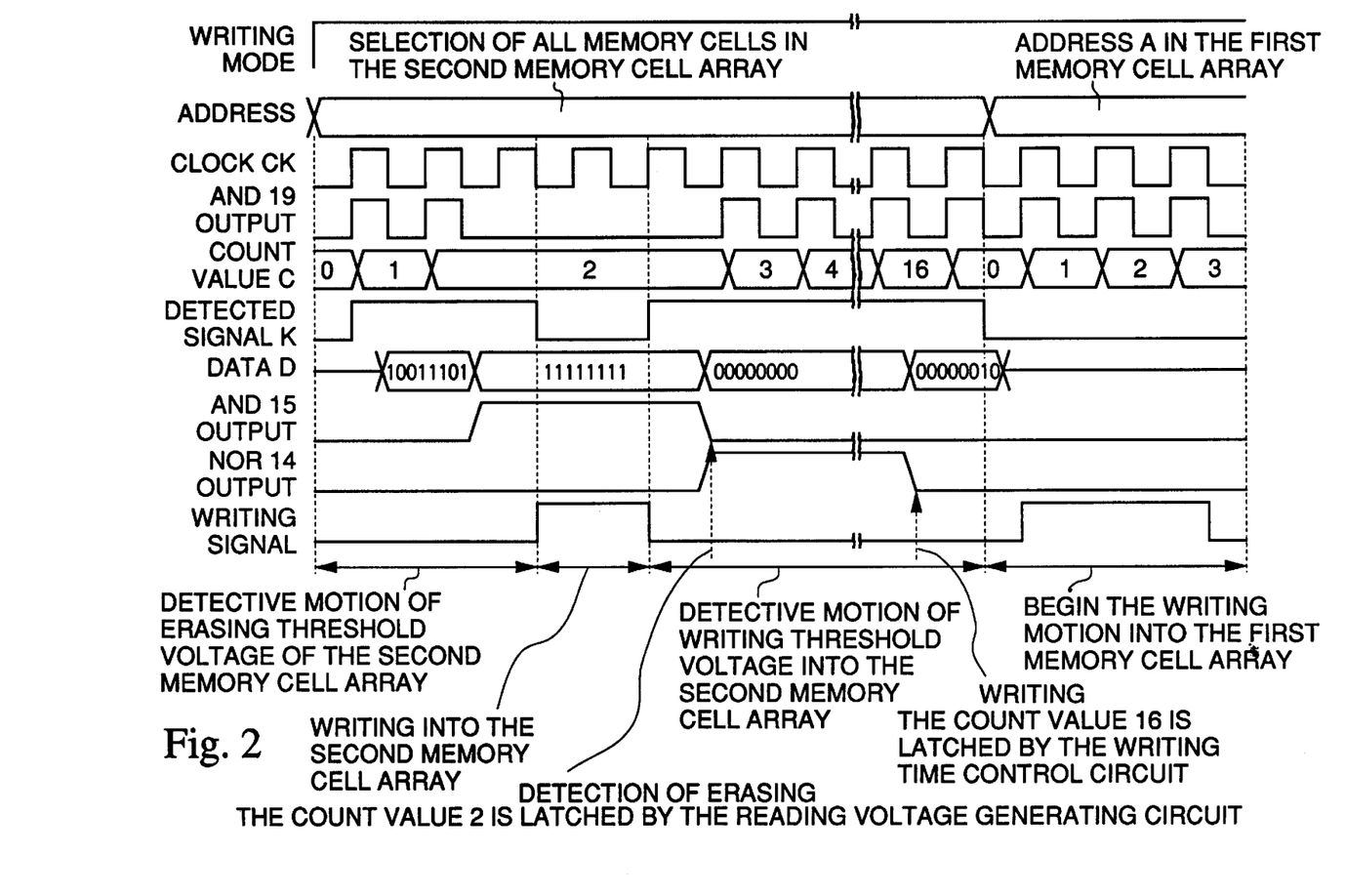
FIG. 2 is a timing-chart showing the action of the non-volatile semiconductor memory according to one embodiment of the present invention.

The operation of the embodiment will be described with reference to FIG. 2 showing a diagram of timings at the time of the writing mode. It is assumed that the first memory cell array 1 and the second memory cell array 2 are both totally erased and they are maintained at the same erasure threshold voltages. Since the operation of the present invention is performed in a mode of writing to the first memory cell array 1, when the writing mode signal becomes "H", the addresses of the second memory cell array are all selected and the erasure threshold voltage of the second memory cell array 2 is detected.

When the detected signal K is "H", the detected voltage corresponding to a 1/N voltage divided by the 1/N circuit 9, is supplied to the second memory cell array 2 through the AND 10. The memory cells of the second memory cell array 2 are turned on, when the detection voltage is higher than the threshold voltage of the memory cells. Thereby, the data D output from the reading control circuit become "H". When the detection voltage is lower than the threshold voltage of the memory cells, the memory cells are turned off, and the data D becomes "L". Thus, the 1/N circuit 9 repeatedly increments the potential level by 1/N when the counter value C is input. And, the detection of the threshold voltage is repeatedly performed until all of the memory cells of the second memory cell array 2 are turned on and the data 17 becomes "H".

When the data D are output as "H", and the erasure threshold voltage of the second memory cell array 2 is detected, the output of the AND 15 is switched to "H" from "L". Consequently, the output of the AND 19 is switched to "L", and the clock CK for inputting to the counter circuit 13 is not output from the AND 19. Thereby, the counting operation of the counter circuit 13 is ceased. The count value C at the time when the counter circuit 13 is stopped is supplied to the reading voltage, and is latched at the reading voltage generating circuit 11 by means of the output signal of the AND circuit 15. The reading voltage generating circuit 11 establishes an optimum reading voltage for the erasure threshold voltage. As a result, the erased memory cells always output the data "H" when they are read.

Data is written in every memory cell of the second memory cell array 2. The writing time used in this writing operation into the second memory cell array is the time established by the writing time control circuit 7 in the preceding writing operation. When writing is completed, the writing threshold voltage in the second memory cell 2 is detected. The counting circuit 13 preserves the count value at the time when the erasure threshold voltage is detected, and a counting operation continues. Since the 1/N circuit 9 continuously supplies the erasure threshold voltage from the detected voltage at the time when the erasure threshold voltage is detected, it detects the writing threshold voltages by repeatedly incrementing the voltage level by 1/N. The writing threshold voltage in the second memory cell array becomes higher than the erasure threshold voltage due to injection of the electric charge by writing, so that only "L" is output from the data D, because all memory cells are switched to the off state by use of the detected voltage which was able to detect the erasure threshold voltage.

Next, when the writing threshold voltage of even one memory cell is judged to be lower than the detection voltage, that is, when even one of the data D becomes "H", the output of NOR 14 is turned into "L" from "H". At this time, the count value C is latched by the writing time control circuit 7. The writing time is established in the writing time control circuit 7 from the difference between the count value C at the time when the writing threshold voltage is detected and the count value C at the time when the erasure threshold voltage is detected. Since the count value C latched by the writing time control circuit 7 has been continuing counting from the time when the erasing threshold value is detected, it is possible to establish a long writing time, if the count value from the time when detecting the erasure threshold voltage to the time of detecting the writing threshold voltage is small such that the optimum writing time may be established for a reading voltage.

At the time of completion of detecting the threshold voltage of the second memory cell array 2, the detecting signal is switched to "L", and writing is performed into the first memory cell array 1 by use of the established writing time. An address in the first memory cell array is designated and the writing operation is performed repeatedly for the writing time established by the writing time control circuit 7 until the writing signal is changed to "H" and until the writing operation reaches to an optional address, and the writing mode is completed. After the writing operation is completed, the reading voltage established by the reading voltage generating circuit 11 is supplied to an optional address in the first memory cell array to drive the reading operation.

As hereinabove described, the present invention uses the second memory cell array, having the same performance as the first memory cell array 1, for detecting the writing and erasure threshold voltages; and the present invention comprises the 1/N circuit 9 and the counter circuit 13, and the voltage generated by the high voltage generating circuit 8 is divided into 1/N by the 1/N circuit 9 and supplied to the second memory cell array 2.

Since the erasure threshold voltage of the second memory cell array 2 must be the voltage which is turned on by the reading voltage, it is judged that all data is detected when all data are switched to "H". The counter circuit 13 continues the counting operation, and the count value output from the counter circuit 13 is input into the 1/N circuit 9, and repeats detection while incrementing the level by 1/N for each input. The count value 12 at the time of completion of detecting the erasure threshold voltage of the second memory cell array 2 is supplied to the reading voltage generation circuit 11, and the optimum reading voltage is established for the erasure threshold voltage.

Next, writing is performed for all of the memory cells in the second memory cell array 2. When the writing operation is completed, the writing threshold voltage of the second memory cell array 2 is detected. Since the counter circuit 13 preserves the count value 12 at the time of detecting the erasure threshold voltage, the counter circuit 13 continues counting. Since the 1/N circuit 9 continues to supply the writing voltage from the detection of the erasure threshold voltage, the writing threshold voltage is detected by repeatedly incrementing the level by 1/N. The writing threshold voltage must be a voltage which is turned off by the reading voltage.

Accordingly, at the time when a voltage of even one of the memory cells becomes lower than the detecting voltage, it is judged that the writing threshold voltage is detected, and the count value C when the writing threshold voltage is detected is latched by the writing time control circuit 7. Since this count value 12 had been continuing from the time when the erasure threshold voltage was detected, it is possible to establish an optimum writing time for the reading voltage by establishing a long writing time, in the case when the count value between the time of detection of the erasure threshold voltage and the time of detection of the writing threshold is limited.

Accordingly, it is possible to write for a writing time by a writing voltage which is always higher than the reading voltage, when writing in the first memory cell array 1, and it is also possible to execute correct reading by setting the reading voltage to more than the erasure threshold voltage and less than the writing threshold voltage, by detecting the erasure threshold voltage and the writing threshold voltage of the second memory cell array 2 which has the same properties as the first memory cell array.

Consequently, in the case when the erasure threshold voltage is degraded to less than the reading voltage or when the writing threshold voltage is degraded to less than the reading voltage due to the manufacturing variance or the stress caused by rewriting, the present invention provides effects to prevent the generation of reading errors caused by the inversion of the reading voltage and the threshold voltage by optimizing the reading voltage and the writing time through a correcting process.

Figure 3:
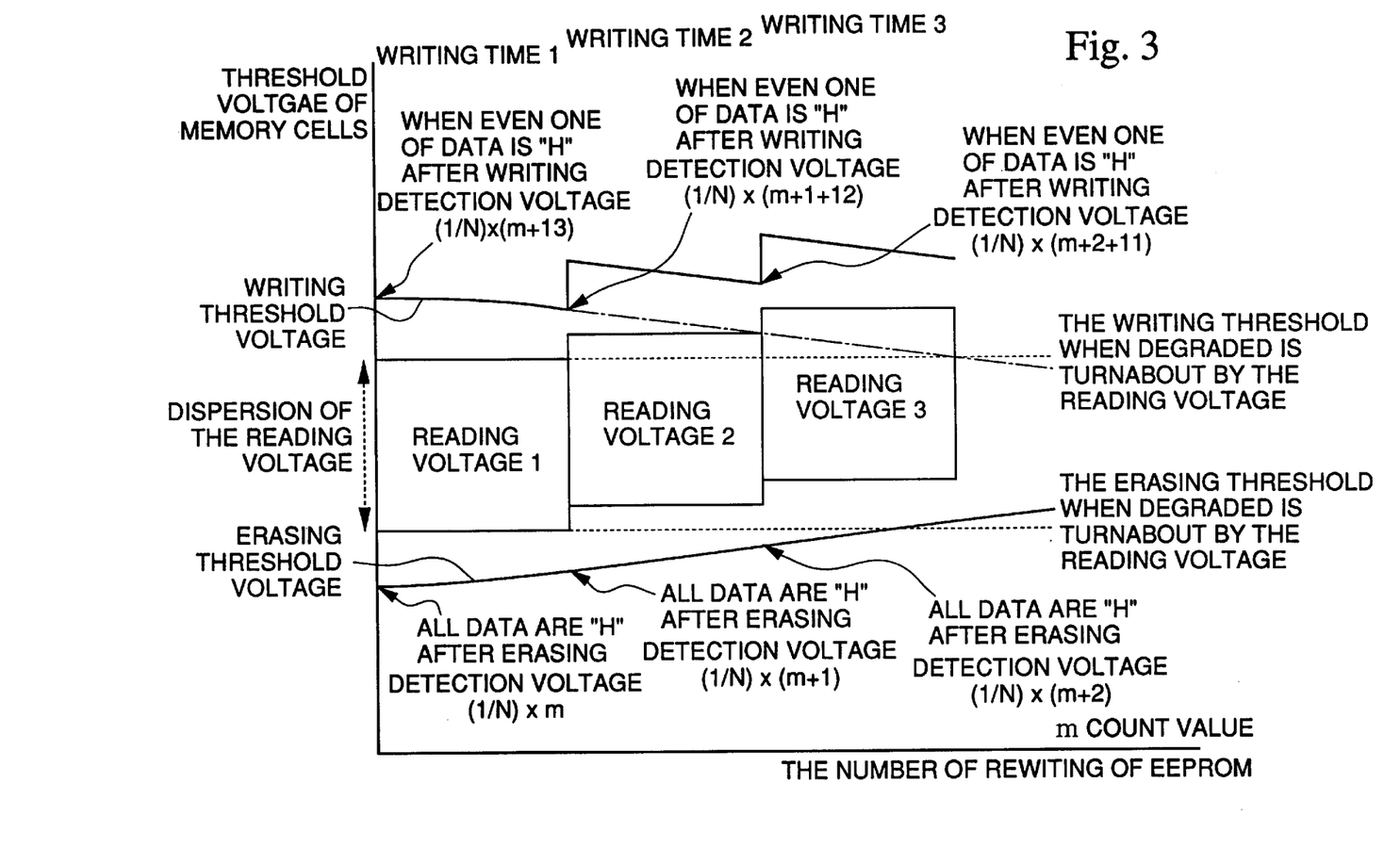
FIG. 3 is a conceptual diagram showing the variation of the threshold voltage of the non-volatile semiconductor memory shown in FIG. 1.

FIG. 3 shows various effects provided by the present invention. In the conventional EEPROM, an increasing number of rewriting times makes it difficult to inject the electric charge into memory cells by writing, which results in reducing the writing threshold voltage. On the other hand, it becomes difficult to discharge the electric charge stored in the memory cell by the erasure, so that the erasure threshold voltage is changed to a higher voltage.

The reading voltage usually varies over a voltage range due to manufacturing variance. Thus, when the writing time and the reading voltage are fixed and the threshold voltage of the memory cell becomes degraded, reading errors may occur because of inversion between the reading voltage and the threshold voltage.

Since the device of the present invention is provided with a memory cell array for detecting the writing threshold voltage and the erasure threshold voltage and the device is designed such that the reading voltage is established from the writing threshold voltage, and that the writing time is established from the erasure threshold voltage, even though the number of rewriting times is increased, the erasing threshold is rendered lower than the reading voltage, and the writing threshold is set higher than the reading voltage. For example, in the case of reading voltage 2, since the erasure threshold voltage is detected at the (m+1)'th time, the reading voltage 2 (FIG. 3) may be established at a higher value than that detected at the m'th time. here, "m" is a natural number. Furthermore, the writing threshold voltage is detected at the (m+1+12)'th time, which means that the writing threshold voltage is detected at the 12th time after detection of erasing threshold voltage; that is, the writing time is longer and the writing threshold voltage is higher than the previous case established at the 13'th time.

As described above, the present invention was explained with reference to an embodiment of the present invention referring to the attached drawings, however, it should be understood that the present invention is not limited to the embodiment described above, and that design modifications which do not departing from the scope of the present invention are included in this invention.

Figure 4:
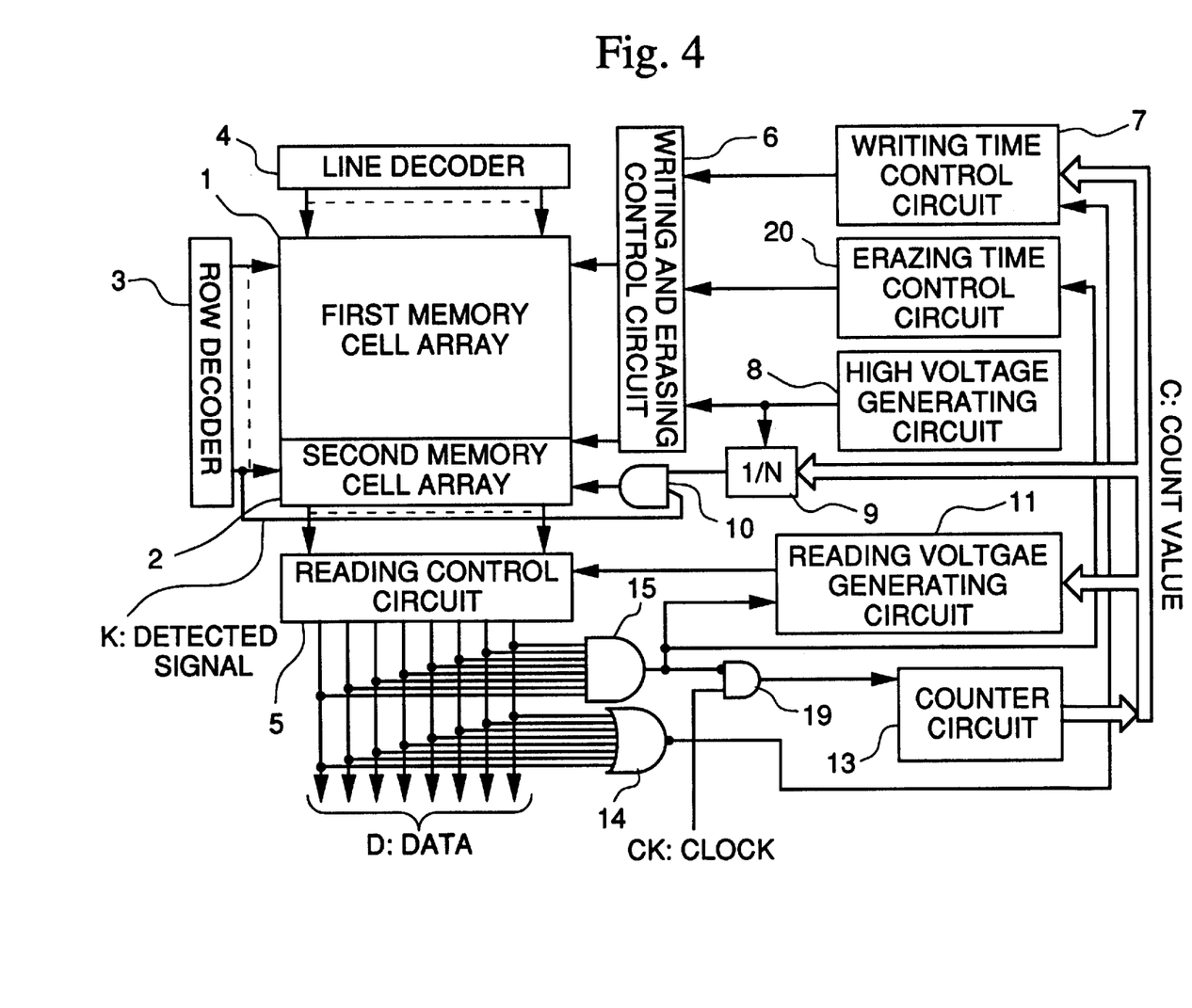
FIG. 4 is a block-diagram showing the structure of the non-volatile semiconductor memory according to the second embodiment of the present invention.

For example, the non-volatile semiconductor memory device according to the second aspect of the present invention comprises an erasing time control circuit 20 in addition to the structure of the first embodiment. Explanations of the other elements other than the erasing time control circuit 20 are omitted.

The erasing time control circuit 20 receives an input of the count value C and executes a comparison between a count value C at the time when the erasure threshold voltage is detected in the previous writing mode, and the count value C when the erasure threshold voltage is detected at the current time. When the count value C at this time is greater than the count value C at the previous detection, the erasing time control circuit 20 makes it possible to establish a longer erasing time. Accordingly, in the next erasing, it is possible to reduce the erasure threshold voltage, because the memory cell array is put into a state to release the electric charge readily.

In addition, the erasing time is established based on the count value C at the erasing time control circuit 20 and is supplied to the first and second memory cell arrays 1 and 2 only for the erasing time through the writing and erasing control circuit 6.

In the second embodiment, the erasure threshold voltage can be optimized by establishing a longer erasing time, and it is possible to reduce the erasure threshold voltage to below the reading threshold voltage, without raising the reading and writing voltages.

According to the first aspect of the present invention, a non-volatile semiconductor memory device comprising: a memory cell array comprising a first memory region in which rewriting is possible, and a second memory region which is provided for detecting the threshold voltages; an erasing means for erasing data stored in the memory cells of said memory cell array; a writing means for writing data to be stored in the memory cells of said memory cell array; a reading means for reading data stored in said memory cell array; a time calculating means for calculating and outputting the erasing time and writing time as a result of calculations by calculating the times required to detecting the threshold voltages for writing and erasing data in the second memory region; and a voltage conversion means for outputting an voltage as a reading voltage after converting the voltage supplied by the voltage generating circuit corresponding to said erasing time and for outputting a voltage as a writing voltage after converting a voltage supplied from the voltage generating circuit corresponding to the writing time; wherein said reading means reads data stored in memory cells of the first memory cell array by said reading voltage, and said writing means writes data to be stored in the memory cells of the memory cell array by said writing voltage.

Therefore, if the erasure threshold voltage of the memory cell array device is degraded to a higher voltage than the reading voltage or if the writing threshold voltage of the memory cell array is degraded to a lower voltage than the reading voltage due to the manufacturing variance or the stress caused by rewriting, it is possible to reduce the threshold voltage of erasing by putting the memory cells in a state of readily discharging the electric charge by applying the reading voltage and the writing voltage obtained by the use of the second memory region to the memory cells in the first memory region for optimizing the reading voltage and writing voltage in the optimum conditions, which results in prevention of reading errors and improves the manufacturing yield.

According to the second aspect of the present invention, the present device has the effect that it is capable of establishing an accurate reading voltage, since the voltage conversion means outputs the reading voltage incremented at an 1/N steps of the voltage supplied from the voltage generating circuit as the erasing time increases.

According to the third aspect of the present invention, the present invention has the effect that it is possible to establish an accurate writing voltage because, as the writing time increases, said voltage conversion means increments the writing voltage each time by 1/N of the voltage supplied from the voltage generating circuit.

According to the fourth aspect of the present invention, the present device is advantageous in that it is capable of adjusting the writing time to the optimum value because the device comprises a writing time calculating means to calculate the writing time from the difference between the writing time and the erasing time. Thus, in the case when the erasure threshold voltage is degraded to a higher voltage than the reading voltage or when the writing threshold voltage is degraded into lower voltage than the writing voltage due to manufacturing variance or the stress caused by rewriting, the device is capable of establishing a longer writing time when the time interval between detection of the erasure threshold voltage and the writing threshold voltage is short.

According to the fifth aspect of the present invention, the present memory device is advantageous in that it is provided with a erasing time establishing means for establishing a longer erasing time of a predetermined length when the required erasing time is longer than the previous erasing time, so that the data stored in the memory cells are adequately erased, and it is possible to prevent the erasure threshold voltage from degrading to less than the reading voltage by optimizing the erasing erasure threshold voltage the memory cells without excessively raising the reading and writing threshold voltages.

What is claimed is:

1. A non-volatile semiconductor memory device comprising:

a memory cell array comprising a first memory region in which rewriting can be freely executed, and a second memory region which is provided for detecting threshold voltages;

an erasing means for erasing data stored in memory cells of said memory cell array;

a writing means for writing data to be stored in the memory cells of said memory cell array;

a reading means for reading data stored in said memory cell array;

a time calculating means for calculating and outputting an erasing time and a writing time as a result of calculations by calculating the times required to detect the threshold voltages for writing and erasing data in the second memory region; and a voltage conversion means for outputting a voltage as a reading voltage after converting a voltage supplied by a voltage generating circuit corresponding to said erasing time and for outputting a voltage as a writing voltage after converting a voltage supplied by the voltage generating circuit corresponding to the writing time;

wherein said reading means reads data stored in the memory cells of the first memory region by said reading voltage, and said writing means writes data to be stored in the memory cells of the memory cell array by said writing voltage.

2. A non-volatile semiconductor memory device according to claim 1, wherein, as the erasing time increases, said voltage conversion means outputs a reading voltage by increments of 1/N (N is a natural number) of the voltage supplied by the voltage generating circuit.

3. A non-volatile semiconductor memory device according to claim 1, wherein, as the writing time increases, said voltage conversion means repeatedly increments the writing voltage by 1/N of the voltage supplied by the voltage generating circuit.

4. A non-volatile semiconductor memory device according to claim 1, wherein, said device further comprises a writing time calculating means for obtaining the writing time for writing data in the memory cells of the first memory region from the difference between said writing time and said erasing time.

5. A non-volatile semiconductor memory device according to claim 1, wherein said device further comprises an erasing time establishing means for the erasing means to establish an erasing time which is longer by a predetermined value, when an erasing time for erasing data in the memory cells in the first memory region at this time is greater than a previous erasing time.

* * * * *